US005537984A

United States Patent [19]

Vogel et al.

[11] Patent Number: 5,537,984
[45] Date of Patent: Jul. 23, 1996

[54] HIGH VOLTAGE SWITCH FOR IGNITION SYSTEMS OF INTERNAL COMBUSTION ENGINES

[75] Inventors: Manfred Vogel, Ditzingen; Werner Herden, Gerlingen; Johann Konrad, Tamm, all of Germany

[73] Assignee: Robert Bosch GmbH, Stuttgart, Germany

[21] Appl. No.: 436,376

[22] PCT Filed: Sep. 8, 1994

[86] PCT No.: PCT/DE94/01029

§ 371 Date: May 22, 1995

§ 102(e) Date: May 22, 1995

[87] PCT Pub. No.: WO95/09302

PCT Pub. Date: Apr. 6, 1995

[30] Foreign Application Priority Data

Sep. 29, 1993 [DE] Germany ............... 43 33 097.5

[51] Int. Cl.[6] .................... F02P 7/073; H03K 17/10; H03K 17/74; H03K 17/78
[52] U.S. Cl. ........................ 123/643; 327/514
[58] Field of Search .................... 123/643, 649, 123/650, 655; 327/514, 515

[56] References Cited

U.S. PATENT DOCUMENTS

| 4,411,247 | 10/1983 | Kunita et al. ............ 123/655 |
| 4,881,512 | 11/1989 | Erskine et al. ........... 123/628 |
| 4,993,395 | 2/1991 | Vogel et al. ............. 123/643 |
| 5,002,034 | 3/1991 | Herden et al. ........... 123/643 |
| 5,109,829 | 5/1992 | Herden et al. ........... 123/643 |
| 5,125,387 | 6/1992 | De Wit et al. ........... 123/643 |
| 5,195,496 | 3/1993 | Gokhale ................. 123/643 |
| 5,369,283 | 11/1994 | Vogel et al. ............. 250/551 |

FOREIGN PATENT DOCUMENTS

| 4032131 | 4/1992 | Germany. |
| WO89/02527 | 3/1989 | WIPO. |
| WO90/15242 | 12/1990 | WIPO. |
| WO91/04579 | 4/1991 | WIPO. |

Primary Examiner—Willis R. Wolfe
Attorney, Agent, or Firm—Kenyon & Kenyon

[57] ABSTRACT

A high voltage switch can be used in an internal combustion engine ignition system to switch a high voltage through to a spark plug upon illumination of a light-sensitive portion of the switch. The high voltage switch includes two sub-stacks of break-over diodes, with the diodes of the two sub-stacks having different properties. The break-over diodes of a first, illuminated sub-stack of the high voltage switch have a break-over voltage with a low dependence on temperature, whereas the break-over diodes of a second, unilluminated sub-stack have a low break-over current with tight tolerances.

5 Claims, 1 Drawing Sheet

HIGH VOLTAGE SWITCH FOR IGNITION SYSTEMS OF INTERNAL COMBUSTION ENGINES

FIELD OF THE INVENTION

The present invention relates to a high voltage switch, particularly to a high voltage switch for use in ignition systems of internal combustion engines.

BACKGROUND INFORMATION

German Published Patent Application No. 40 32 131 (the "'131 reference") describes a high voltage switch which assumes the function of an ignition voltage distributor with quiescent high voltage distribution. This high voltage switch consists of semiconductor elements which have light-sensitive zones, and the light-sensitive zones being so actuated by light-emitting elements that they connect through at a prescribed time, e.g., in accordance with the firing order. The individual semiconductor elements in the device of the '131 reference are break-over diodes which are arranged in a cascade circuit. These break-over diodes provide the advantage that when the break-over voltage is reached the high voltage which is built up on the secondary side is suddenly connected through to the spark plugs, so that a voltage loss caused by possible shunt connections, for example due to carbon fouling, is avoided. With the device of the '131 reference, it is not necessary to irradiate the entire cascade circuit with optical energy. It is sufficient to irradiate only part of the break-over diode cascade so that only some of the break-over diodes are switched by means of light and the remaining break-over diodes are connected through when the prescribed voltage is reached and as a result a desired gradient steepening effect is achieved.

SUMMARY OF THE INVENTION

The present invention provides a high voltage switch which has the advantage that the first illuminated sub-stack of break-over diodes has a break-over voltage with a low temperature coefficient. However, at the same time these break-over diodes have break-over currents with a high temperature coefficient. They are thus particularly suitable for the illuminated part since they do not act here as a break-over diode but rather as a light-triggered switch. As a result of the arrangement of the unilluminated part of the high voltage switch, the gradient steepening effect is maintained. This arises from the overhead ignition of the illuminated part of the high voltage switch.

It is particularly advantageous that break-over diodes with low break-over currents with tight tolerances are obtained for the unilluminated second sub-stack of the break-over diode cascade since, in this way, the operation of the break-over diode is maintained for the gradient steepening effect. The combination of these two types of break-over diodes has the advantage that a low temperature coefficient of the switch is obtained and thus the number of semiconductor elements can be reduced. Finally, it is advantageous that the two sub-stacks of the high voltage switch can also consist of two discrete, separately packed components. All that has to be ensured here is that the connecting length between these cascade components be as short as possible.

DETAILED DESCRIPTION

Figure 1:
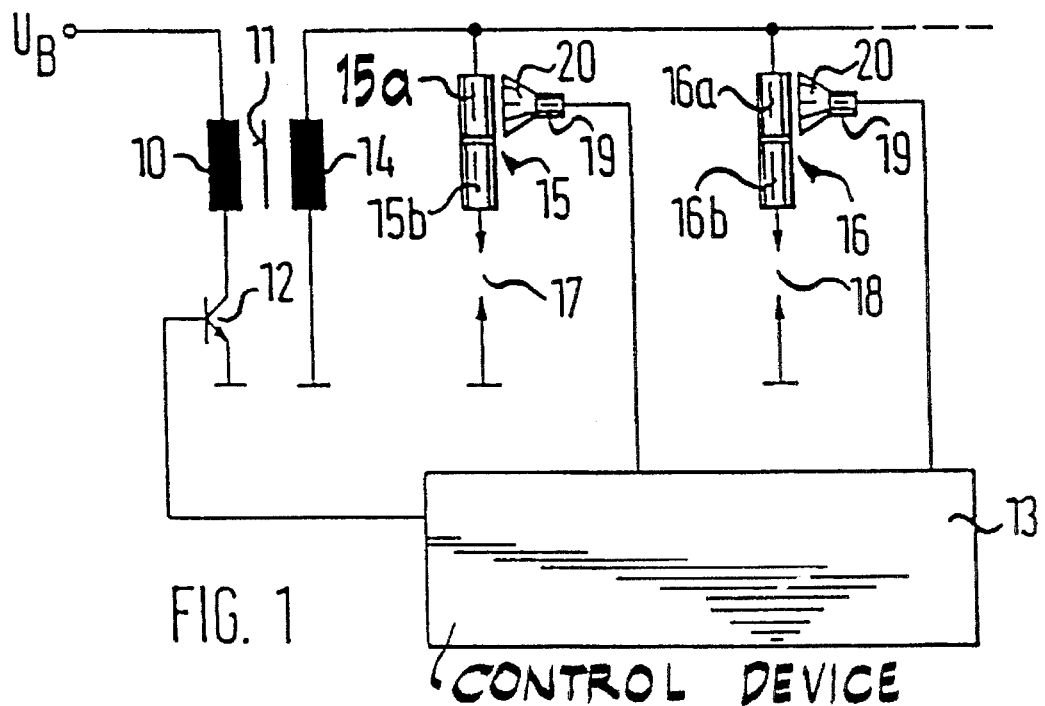
FIG. 1 is a schematic representation of an ignition system with a high voltage switch, in accordance with the present invention, having two sub-stacks packed together.

FIG. 1 is a diagrammatic view of an internal combustion engine with an ignition system and quiescent high voltage distribution, only two ignition coils being illustrated but a multitude of further ignition coils being possible. A battery voltage $U_B$ is connected to a primary winding 10 of an ignition coil 11, a switching transistor 12 being connected in series with the primary winding 10. The switching transistor 12 is continuously actuated by a control device 13 via its base terminal in order to produce a secondary-side high voltage to the ignition coil 11. A secondary winding 14 of the ignition coil 11 is connected on the one hand to ground and, on the other hand, to spark plugs 17 and 18 in each case via a high voltage switch 15 or 16 respectively. The high voltage switches 15 and 16 are each divided into two sub-stacks 15a and 15b as well as 16a and 16b, the sub-stacks 15a and 16a being arranged on the side assigned to the ignition coil and the sub-stacks 15b and 16b being on the side assigned to the spark plug. The sub-stacks 15a and 16a are actuated at their light-sensitive regions via a light emitting source, for example an LED, by the control device 13 in accordance with the ignition specification and thus transmit the ignition voltage to the spark plugs. The transmission of light from the light-emitting element 19 to the sub-stack 15a or 16a to be illuminated takes place by means of a fiber-optic rod 20. However, it is also conceivable to have an arrangement of individual sub-stacks in which the unilluminated sub-stack is arranged on the side assigned to the ignition coil and the illuminated sub-stack is arranged on the side assigned to the spark plug.

Figure 2:
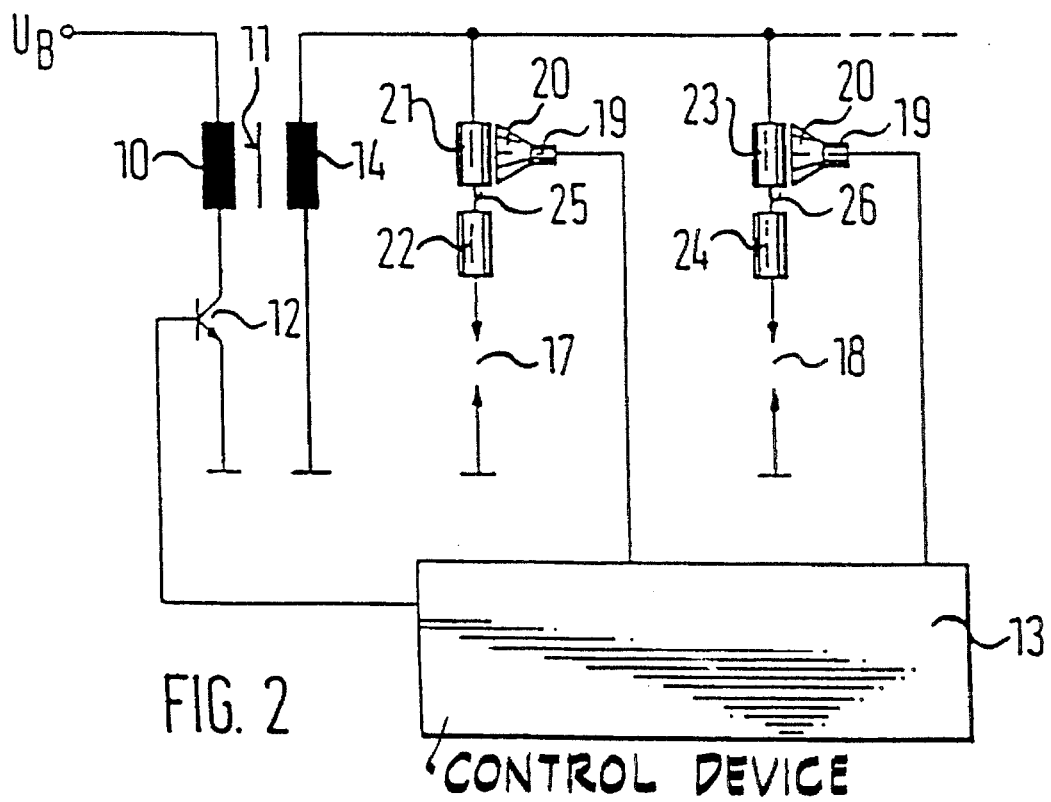
FIG. 2 is a schematic representation of an ignition system with a high voltage switch, in accordance with the present invention, having two separately packed cascade components.

In FIG. 2, the ignition circuit is constructed exactly as in FIG. 1 so that identical reference symbols are used for identical parts. However, the high voltage switch has been provided with other reference symbols, since in FIG. 2 the high voltage switch consists of two sub-stacks 21 and 22 as well as 23 and 24 which are separated from one another. With this separate arrangement of the sub-stacks, all that has to be ensured is that the connection 25 or 26 between the sub-stacks is to be selected to be as short as possible in order to keep line capacitances as small as possible.

Break-over diodes of the unilluminated sub-stack have a relatively low break-over current between 1 mA and approximately 15 mA over the entire temperature range. These low break-over currents are required for the operation as a break-over diode with gradient steepening effect Break-over diodes with relatively low break-over currents have, however, in each case a high temperature coefficient of the break-over voltage, i.e. the break-over voltage decreases as the temperature increases. If the cascade circuit only consisted of the break-over diodes with these properties, because of the high temperature coefficient, a high number of break-over diodes would be required in order to be able to maintain the desired overall voltage over the entire temperature range.

In contrast with this, the break-over diodes with low temperature coefficient of the break-over voltage, such as are used for the illuminated part of the stack, have a high temperature coefficient of the break-over currents, so that these break-over diodes are not suitable for realizing the gradient steepening effect and, instead, can be used advantageously for the light-triggered part of the break-over diode cascade.

What is claimed is:

1. A high voltage switch for coupling between a high voltage source and a spark plug, the high voltage switch comprising:

a plurality of break-over diodes having a preselectable break-over voltage that can be reduced by irradiation with optical energy, wherein:

the plurality of break-over diodes are arranged in a cascade circuit in first and second sub-stacks, the first sub-stack being selectively illuminated with optical energy, and the break-over diodes of the first sub-stack have a break-over voltage with a lower temperature coefficient than the break-over diodes of the second sub-stack.

2. The high voltage switch of claim 1, wherein the break-over diodes of the second sub-stack have a second break-over current lower than a first break-over current of the break-over diodes of the first sub-stack.

3. The high voltage switch of claim 2, wherein the second break-over current of the break-over diodes of the second sub-stack is between approximately 1 mA and 15 mA.

4. The high voltage switch of claim 1, wherein the first and second sub-stacks are packaged separately and connected in series.

5. The high voltage switch of claim 4, wherein a length of a connection between the first and second sub-stacks is minimized.

* * * * *